United States Patent
Moroz et al.

(10) Patent No.: US 8,349,668 B2
(45) Date of Patent: *Jan. 8, 2013

(54) STRESS-ENHANCED PERFORMANCE OF A FINFET USING SURFACE/CHANNEL ORIENTATIONS AND STRAINED CAPPING LAYERS

(75) Inventors: Victor Moroz, San Jose, CA (US); Tsu-Jae King Liu, Fremont, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/103,677

(22) Filed: May 9, 2011

(65) Prior Publication Data

US 2011/0212601 A1    Sep. 1, 2011

Related U.S. Application Data

(62) Division of application No. 11/755,715, filed on May 30, 2007, now Pat. No. 7,939,862.

(51) Int. Cl.
*H01L 21/20* (2006.01)

(52) U.S. Cl. ........ 438/150; 438/149; 438/478; 438/479; 438/517; 257/213; 257/255; 257/E29.01

(58) Field of Classification Search ................... 257/213, 257/255, E29.01; 438/150, 478, 479, 517
See application file for complete search history.

(56) References Cited

U.S. PATENT DOCUMENTS

| | | | |
|---|---|---|---|
| 6,413,802 B1 | 7/2002 | Hu et al. | |
| 7,339,213 B2 | 3/2008 | Maeda et al. | |
| 2005/0191795 A1 | 9/2005 | Chidambarrao et al. | |
| 2005/0280103 A1 | 12/2005 | Langdo et al. | |
| 2006/0284255 A1 | 12/2006 | Shin et al. | |

OTHER PUBLICATIONS

Huang et al. "Sub-50 nm P-Channel FinFet", IEEE Transactions on Electron Devices, vol. 48, No. 5, May 2001, pp. 880-886.
Moroz et al. "Analyzing Strained-Silicon Option for Stress-Engineering Transistors", Solid State Technology, Jul. 2004 Edition, Copyright 2004 by PennWell Corporation, 3 pages.
Moroz et al. "Options At the 45nm Node Include Engineered Substrates", Solid State Technology, Jul. 2005 Edition, Copyright 2005 by PennWell Corporation, 4 pages.
Smith "Piezoresistance Effect in Germanium and Silicon", Physical Review, vol. 94, No. 1, Apr. 1, 1954, pp. 42-49.
Kanda "A Graphical Representation of The Piezoresistance Coeffcients In Silicon", IEEE Transactions on Electron Devices, vol. Ed-29, No. 1, 1982 IEEE, pp. 64-70.
Standard. (2007). In The American Heritage Dictionary of the English Language. Boston, Ma: Houghton Mifflin. Retrieved Jul. 2, 2009 from http://www.credoreference.com/entry/hmdictenglang/standard.

*Primary Examiner* — Samuel Gebremariam
*Assistant Examiner* — Naima Kearney
(74) *Attorney, Agent, or Firm* — Bever, Hoffman & Harms, LLP; Jeanette S. Harms

(57) ABSTRACT

Different approaches for FinFET performance enhancement based on surface/channel direction and type of strained capping layer are provided. In one relatively simple and inexpensive approach providing a performance boost, a single surface/channel direction orientation and a single strained capping layer can be used for both n-channel FinFETs (nFinFETs) and p-channel FinFETs (pFinFETs). In another approach including more process steps (thereby increasing manufacturing cost) but providing a significantly higher performance boost, different surface/channel direction orientations and different strained capping layers can be used for nFinFETs and pFinFETs.

20 Claims, 3 Drawing Sheets

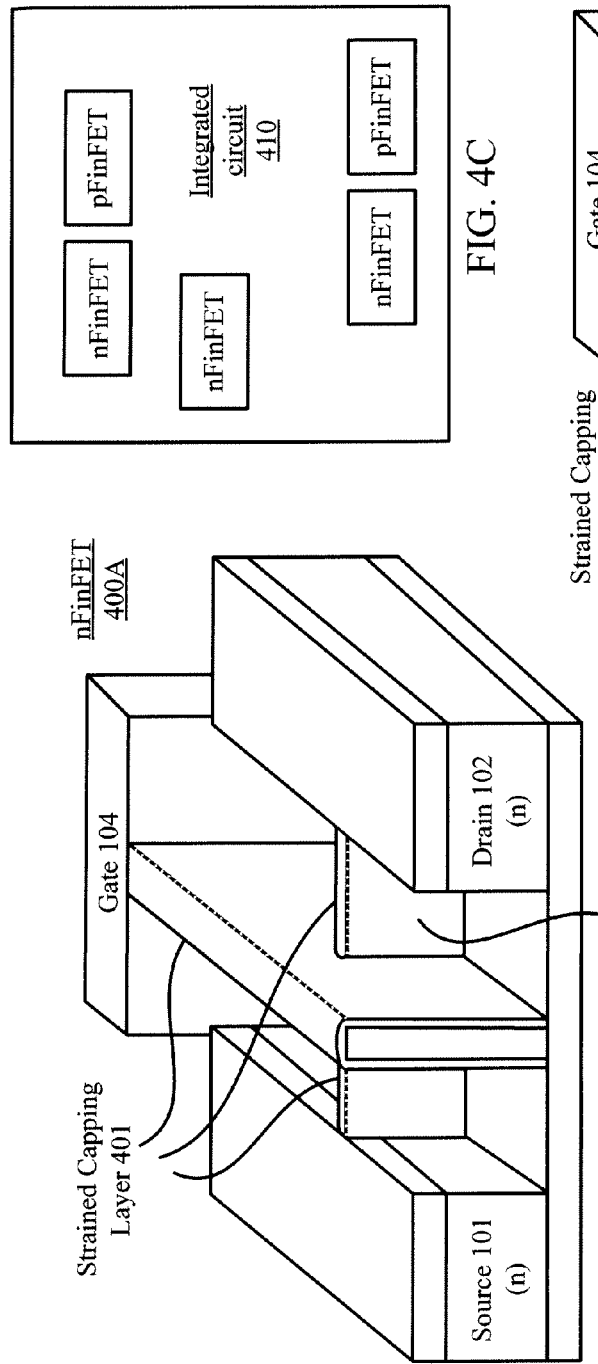
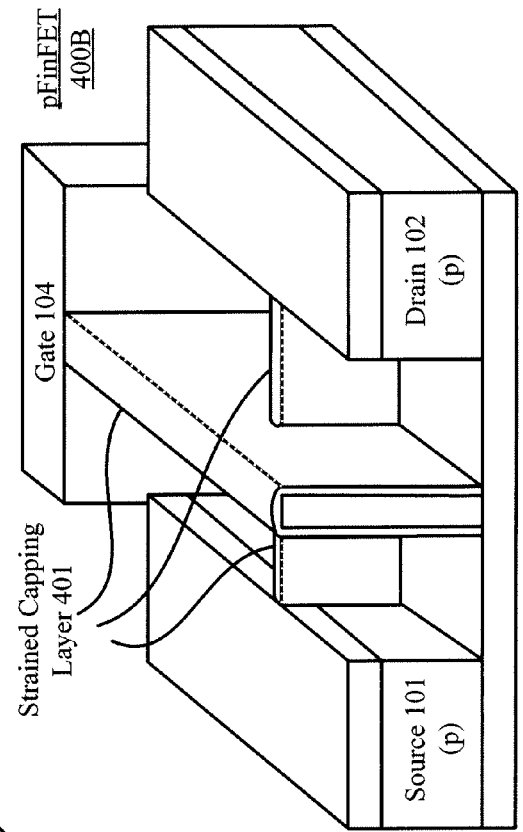
FIG. 4A
FIG. 4B
FIG. 4C

STRESS-ENHANCED PERFORMANCE OF A FINFET USING SURFACE/CHANNEL ORIENTATIONS AND STRAINED CAPPING LAYERS

RELATED APPLICATIONS

This application is a divisional of U.S. patent application Ser. No. 11/755,715, entitled "Stress-Enhanced Performance Of A Finfet Using Surface/Channel Orientations And Strained Capping Layers" filed May 30, 2007.

BACKGROUND OF THE INVENTION

1. Field of the Invention

The present invention relates to FinFET devices and in particular to improving the stress-enhanced performance of FinFET devices using one or more surface/channel orientations and one or more strained capping layers.

2. Description of the Related Art

Conventional field effect transistors (FETs) have a planar structure in which the surfaces of the source, drain, and channel are located substantially in the same plane. In contrast, FIG. 1 illustrates an exemplary non-planar transistor, i.e. a FinFET 100. In this embodiment, FinFET 100 includes a source 101, a drain 102, and a channel 103 that is formed along the sidewalls of a vertical, silicon "fin". A gate oxide (not shown) and a hard mask 105 (formed from an insulating layer) isolate a gate 104 from the other transistor elements of FinFET 100.

As shown in FIG. 1, gate 104 straddles channel 103. In this configuration, gate 104 can be characterized as being two gates in planes on either side of channel 103. This gate and channel structure can effectively enhance gate control and drive current. In one embodiment shown in FIG. 2, spacers 201 can be formed on either side of gate 104 of FinFET 200. Spacers 201 can be used to protect the channel from impurities to be implanted in source 101 and drain 102 (thereby ensuring that source 101 and drain 102 are conductors, but keeping the channel a semiconductor). Both FinFETs 100 and 200 are described in further detail in U.S. Pat. No. 6,413,802. FinFETs are expected to replace the current state-of-the-art bulk CMOS transistors at the 32 nm technology node.

Stress engineering has been recently introduced to boost performance of CMOS transistors. As used herein, the term "surface" (shown generically as "(XXX)") refers to the crystalline orientation of the wafer surface, whereas the term "channel direction" (shown generically as "<XXX>") refers to the crystalline orientation of the current. Notably, production CMOS transistors have a single standard surface/channel direction combination, i.e. (100)/<110>. Moreover, typical stress engineering used in the industry is a simple uniaxial stress pattern.

For FinFETs, there are more surface/channel directions to choose from. Thus, stress engineering can potentially include complex 3-dimensional stress patterns rather than simple uniaxial (or biaxial stress) patterns. U.S. Patent Publication 2006/0284255 (filed by Shin, entitled "Complementary Field-Effect Transistors Having Enhanced Performance With A Single Capping Layer", and published on Dec. 21, 2006) teaches one embodiment in which NMOS transistors are formed in silicon having a (100) surface and PMOS transistors are formed in silicon having a (110) surface. For the (100) surface, a tensile film (capping layer) induces tensile stress in the channel region of the NMOS transistors, which improves electron mobility in the stressed silicon. In contrast, for the (110) surface, the same tensile film (capping layer) induces compressive stress in the channel region of the PMOS transistors, which improves hole mobility in the stressed silicon.

In another embodiment, Shin teaches forming NMOS transistors in silicon having a (110) surface and forming PMOS transistors in silicon having a (100) surface. For the (110) surface, a compressive film (capping layer) induces tensile stress in the channel region of the NMOS transistors, which improves electron mobility in the stressed silicon. In contrast, for the (100) surface, the same tensile film (capping layer) induces compressive stress in the channel region of the PMOS transistors, which improves hole mobility in the stressed silicon.

In summary, Shin teaches that a single stressed layer of silicon nitride can be formed over the entire transistor structure (e.g. FinFET 100 or 200) to induce stress in the channel region (wherein the type of stress depends on the surface crystalline orientation of the channel). This capping layer can enhance mobile carrier mobility. Shin does not address the effect of channel direction on performance or the use of multiple stressed layers.

Therefore, a need arises for a method and a structure to improve carrier mobility in FinFETs. This method and structure can advantageously take into account the effect of channel direction as well as multiple strained capping layers.

BRIEF DESCRIPTION OF THE FIGURES

FIGS. 4A and 4B illustrate an nFinFET and a pFinFET having a strained capping layer. FIG. 4C illustrates an integrated circuit including a plurality of nFinFETs and pFinFETs.

SUMMARY OF THE INVENTION

Figures 1, 2:
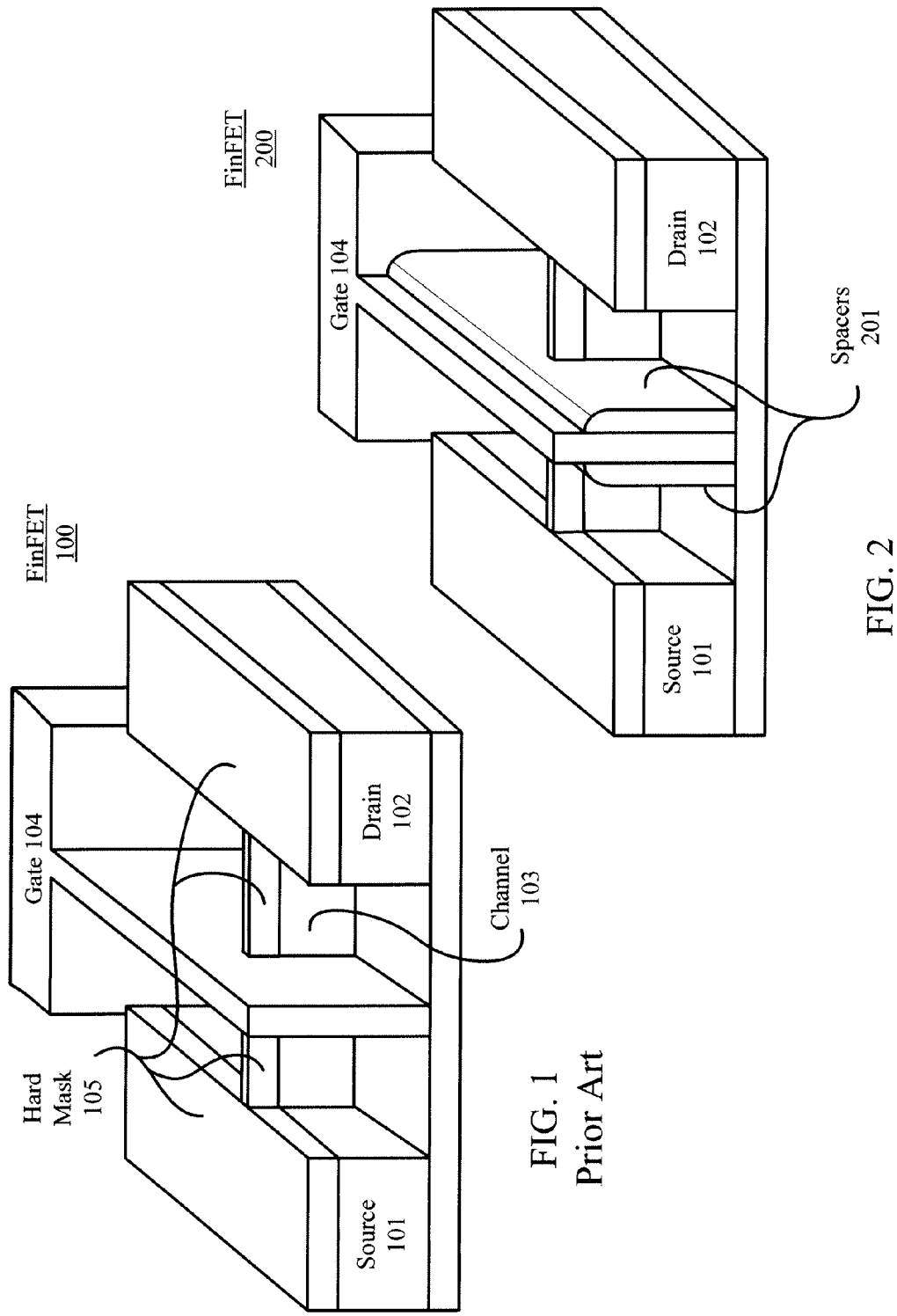
FIG. 1 illustrates a standard FinFET.
FIG. 2 illustrates a standard FinFET with spacers.

Different approaches for FinFET performance enhancement based on surface/channel direction orientations and type of strained capping layer can be provided.

In one relatively simple and inexpensive approach providing a performance boost, a single surface/channel direction orientation and a single strained capping layer can be used for both n-channel FinFETs (nFinFETs) and p-channel FinFETs (pFinFETs). For example, a FinFET made using this approach can include a source, a drain, and a vertical channel connecting the source and the drain, wherein the vertical channel forms a fin. Notably, the fin has a (100) surface orientation and a <110> channel direction orientation. After a gate is formed to straddle the fin, a compressive capping layer can be formed to cover at least the fin and the gate to increase carrier mobility in the FinFET. In one embodiment, the compressive capping layer is silicon nitride formed between 40 nm and 100 nm thick (e.g. approximately 50 nm thick) and has approximately 2.5 GPa compressive stress. This approach can advantageously improve electron mobility in nFinFETs by 29% and hole mobility in pFinFETs by 137%.

In another approach including more process steps (thereby increasing manufacturing cost) but providing a significantly higher performance boost, dual surface/channel direction orientations and dual strained capping layers can be used for nFinFETs and pFinFETs. For example, an integrated circuit (IC) made using this approach includes a plurality of Fin-FETs. Each FinFET transistor includes a source, a drain, and a vertical channel connecting the source and the drain, wherein the vertical channel forms a fin. Notably, the fins of nFinFETs are formed with a (100) surface orientation and a <100> channel direction orientation, whereas the fins of pFinFETs are formed with a (110) surface orientation and a <110> channel direction orientation. After forming gates to straddle the fins, strained capping layers are formed to cover at least the fins and the gates to increase carrier mobility in the FinFETs. The strained capping layer of the nFinFETs is a tensile capping layer, whereas the strained capping layer of the pFinFETs is a compressive capping layer. In one embodiment, the strained capping layers for both the nFinFETs and the pFinFETs is silicon nitride deposited between 40 nm and 100 nm thick (e.g. approximately 50 nm thick). The compressive capping layer has approximately −2.5 GPa compressive stress, whereas the tensile capping layer has approximately +2.5 GPa tensile stress. This approach can advantageously improve electron mobility in nFinFETs by 114% and hole mobility in pFinFETs by 360%.

DETAILED DESCRIPTION OF THE FIGURES

Different approaches for FinFET performance enhancement based on surface/channel direction and type of strained capping layer can be provided. In a first relatively simple and inexpensive approach providing a performance boost, a single surface/channel direction orientation and a single strained capping layer can be used for both n-channel FinFETs (nFinFETs) and p-channel FinFETs (pFinFETs). In a second approach including more process steps (thereby increasing manufacturing cost) but providing a significantly higher performance boost, different surface/channel direction orientations and different strained capping layers can be used for nFinFETs and pFinFETs.

Figure 3:
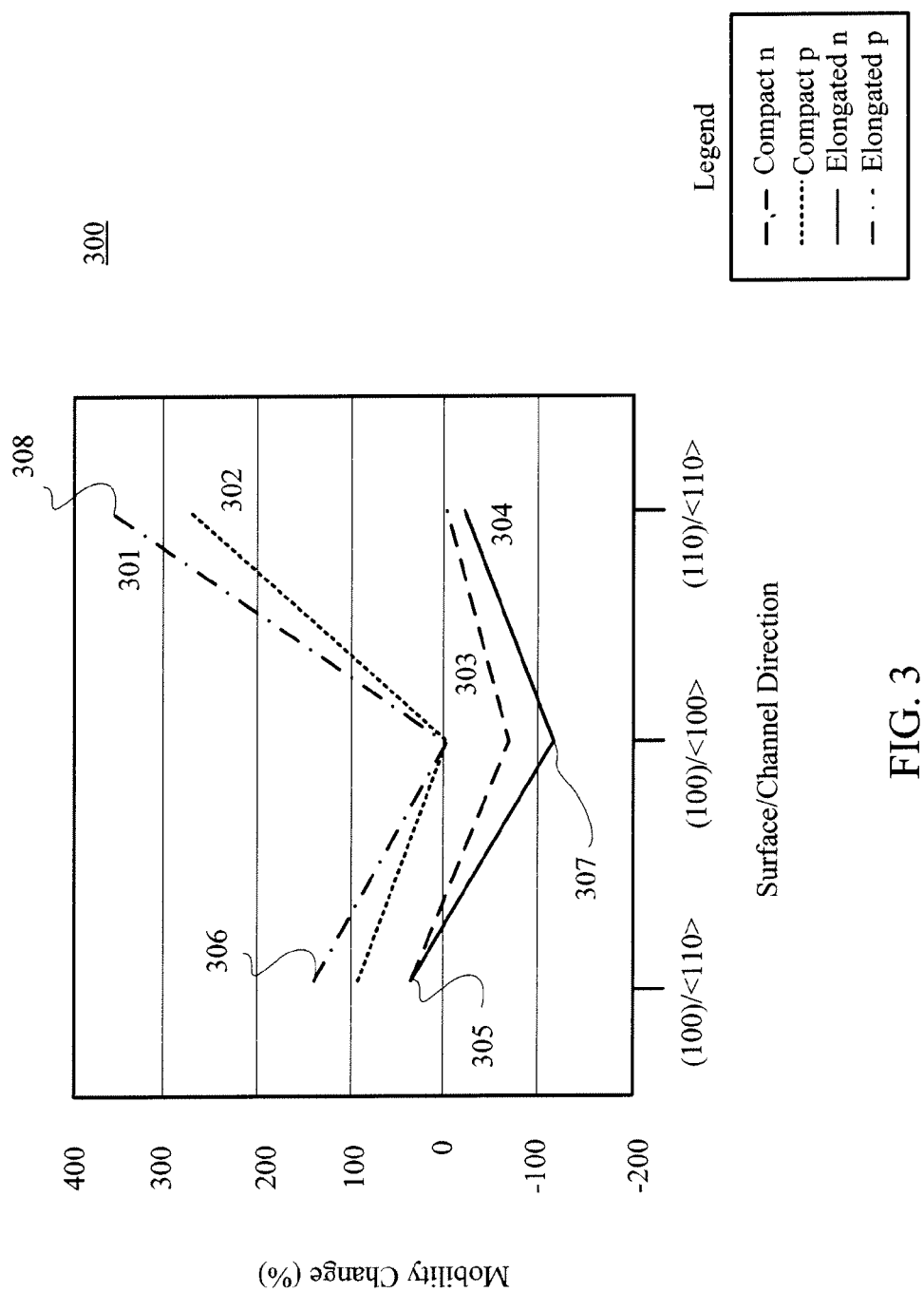
FIG. 3 illustrates a graph plotting mobility change (%) versus surface/channel direction.

FIG. 3 illustrates a graph 300 plotting mobility change (%) versus surface/channel direction. Note that to generate graph 300, stress values were calculated using a three-dimensional stress analysis tool and these stress values were then converted to mobility enhancement using standard silicon piezoresistance coefficients. In graph 300, three potential FinFET surface/channel direction orientations are provided: (100)/<110>, (100)/<100>, and (110)/<110>. Plot 301 (a dash-dot line) corresponds to the mobility change of an "elongated" pFinFET, whereas plot 302 (a dotted line) corresponds to the mobility change of a "compact" pFinFET. Plot 303 (a dashed line) corresponds to the mobility change of a "compact" nFinFET. Finally, plot 304 (a solid line) corresponds to the mobility change of an "elongated" nFinFET. Note that the "elongated" transistors have a fin length (i.e. distance from source to drain) of 100 nm whereas the "compact" transistors have a fin length of 50 nm.

In accordance with one embodiment, both nFinFETs and pFinFETs can be formed with a single surface/channel direction orientation, i.e. the (100)/<110> orientation, and a single strained capping layer. This single strained capping layer can be a silicon nitride layer conformally deposited on the gates and channels of the FinFETs. In one embodiment, this silicon nitride layer can be between 40-100 nm thick (e.g. approximately 50 nm thick) and have a compressive stress of 2.4 GPa. FIGS. 4A and 4B illustrate an nFinFET and a pFinFET having a strained capping layer. FIG. 4C illustrates an integrated circuit 410 including a plurality of nFinFETs and pFinFETs (not drawn to scale), which would both have improved mobility by using the above-described orientation and capping layer.

Table 1, which is shown below, indicates the stress (MPa), change in electron mobility (%), and change in hole mobility (%) in FinFETs having a (100)/<110> orientation and a strained capping layer 50 nm thick with a compressive stress of 2.4 GPa. Note that conversion from stress to mobility enhancement in this table was done using standard silicon piezoresistance coefficients.

TABLE 1

|  | Normal | Transverse | Longitudinal |
| --- | --- | --- | --- |
| Stress (MPa) | −600 | +1160 | −800 |
| E. Mobility Δ | +30 | +23 | −24 |
| H. Mobility Δ | 0 | +81 | +56 |

Note that negative and positive values in different planes (i.e. normal, transverse, and longitudinal) can affect one another, but an overall change in stress and mobility are the most important factors to consider. That is, due to crystal symmetry, either a "+" change or a "−" change in any one plane is possible, but the goal is to maximize the total mobility enhancement (i.e. the sum of the three mobility enhancement components). Thus, for example, with respect to the electron mobility change, an overall change of 29% (i.e. 30+23−24) results. This value is shown in FIG. 3 as point 305. In contrast, with respect to hole mobility change, an overall change of 137% (i.e. 0+81+56) results. This value is shown in FIG. 3 as point 306.

In another embodiment, nFinFETs and pFinFETs can be formed with different surface/channel direction orientations and different strained capping layers. Specifically, pFinFETs can be formed with a (110)/<110> orientation and a compressive strained capping layer, whereas nFinFETs can be formed with a (100)/<100> orientation and a tensile strained capping layer. These combinations can result in significant performance enhancements. For example and referring to FIG. 3, an elongated nFinFET can have a hole mobility change of −114% as shown at node 307, whereas an elongated pFinFET can have an electron mobility change of +360% as shown at node 308. Note that even compact FinFETs have carrier mobility change using different surface/channel direction orientations and different strained capping layers. Further note that FIG. 3 illustrates mobility changes for a compressive capping layer to simplify graph 300. Because a compressive capping layer is used for pFinFETs and a tensile capping layer is used for nFinFETs in this embodiment, both the electron mobility and the hole mobility are enhanced, thereby making both enhancements positive (e.g. the elongated nFinFET actually has a hole mobility of +114%).

In one embodiment, silicon nitride can be used for both the compressive and tensile strained capping layer. That is, silicon nitride can be easily modulated to provide either tensile or compressive stress. Further, silicon nitride is a rigid material that can provide sustained strain on the channel. Yet further, silicon nitride is commercially available.

For the results shown in FIG. 3 with respect to the (100)/<100> and (110)/<110> orientations, a silicon nitride layer can be conformally deposited on the gates and channels of the FinFETs to a thickness of 40-100 nm thick (e.g. approximately 50 nm thick) and have a stress of 2.4 GPa (i.e. −2.4 GPa for pFinFETs and +2.4 GPa for nFinFETs). Note that in other embodiments, the strained capping layers can include insulating materials having different compositions, wherein each insulating material is rigid enough to provide sustained strain (compressive or tensile, as appropriate) on the channel.

Although illustrative embodiments of the invention have been described in detail herein with reference to the accompanying figures, it is to be understood that the invention is not limited to those precise embodiments. They are not intended to be exhaustive or to limit the invention to the precise forms disclosed.

For example, although the strained capping layer can be a single deposition layer, in other embodiments, the strained capping layer can include multiple deposition layers, wherein each deposition layer includes the same material but may or may not have the same built-in stress. In some cases, using a multiple deposition process for the strained capping layer can provide increased carrier mobility.

Note that both the single strained capping layer approach and the dual strained capping layer approach can be easily incorporated into standard IC manufacturing flow. That is, because each strained capping layer is an insulator, this layer can be used in the IC manufacturing flow without affecting the subsequent IC layers.

Further note that although both approaches can be used for FinFETs with or without spacers, increased carrier mobility can result from providing a strained capping layer (or layers) on the FinFETs without spacers (e.g. see a strained capping layer 401 on nFinFET 400A shown in FIG. 4A and on pFinFET 400B shown in FIG. 4B), thereby ensuring more strain on the channel.

Yet further note that in terms of the layout, having "long" devices with relatively large source-to-drain distance and relatively small fin-to-fin distance (where multiple fins are provided within one FinFET) can further increase stress-induced performance gain.

Accordingly, it is intended that the scope of the invention be defined by the following Claims and their equivalents.

The invention claimed is:

1. A method of manufacturing FinFETs to enhance carrier mobility, the FinFETs including both nFinFETs and pFinFETs, the method comprising:
for each FinFET,
connecting a source and a drain of the FinFET with a vertical channel, the vertical channel forming a fin with a (100) surface orientation and a <110> channel direction orientation above a substrate of the FinFET;
forming a gate over the fin; and
forming a compressive capping layer over at least the fin and the gate to increase carrier mobility in the FinFET,
wherein the surface orientation, the channel direction orientation, and the compressive capping layer increase electron mobility for the nFinFETs and increase hole mobility for the pFinFETs, thereby improving both the nFinFETs and the pFinFETs.

2. The method of claim 1, wherein the compressive capping layer is silicon nitride.

3. The method of claim 2, wherein the silicon nitride is deposited between 40 nm and 100 nm thick.

4. The method of claim 2, wherein the silicon nitride is deposited approximately 50 nm thick.

5. The method of claim 2, wherein the compressive capping layer of silicon nitride provides approximately 2.5 GPa compressive stress.

6. A manufacturing process of fabricating FinFETs to enhance carrier mobility, the FinFETs including both nFinFETs and pFinFETs, the manufacturing process comprising:
for each FinFET,
connecting a source and a drain of the FinFET with a vertical channel, the vertical channel forming a fin with a (100) surface orientation and a <110>channel direction orientation above a substrate of the FinFET;
forming a gate over the fin; and
forming a compressive capping layer over at least the fin and the gate to increase carrier mobility in the FinFET,
wherein the surface orientation, the channel direction orientation, and the compressive capping layer increase electron mobility for the nFinFETs and increase hole mobility for the pFinFETs, thereby improving both the nFinFETs and the pFinFETs.

7. The manufacturing process of claim 6, wherein the compressive capping layer is silicon nitride.

8. The manufacturing process of claim 7, wherein the silicon nitride is deposited between 40 nm and 100 nm thick.

9. The manufacturing process of claim 7, wherein the silicon nitride is deposited approximately 50 nm thick.

10. The manufacturing process of claim 7, wherein the compressive capping layer of silicon nitride provides approximately 2.5 GPa compressive stress.

11. An integrated circuit (IC) manufacturing technique, the IC including nFinFETs and pFinFETs, the IC manufacturing technique comprising:
for each FinFET,
connecting a source and a drain of the FinFET with a vertical channel, the vertical channel forming a fin with a (100) surface orientation and a <110>channel direction orientation above a substrate of the FinFET;
forming a gate over the fin; and
forming a compressive capping layer over at least the fin and the gate to increase carrier mobility in the FinFET,
wherein the surface orientation, the channel direction orientation, and the compressive capping layer increase electron mobility for the nFinFETs and increase hole mobility for the pFinFETs, thereby improving both the nFinFETs and the pFinFETs.

12. The IC manufacturing technique of claim 11, wherein the compressive capping layer is silicon nitride.

13. The IC manufacturing technique of claim 12, wherein the silicon nitride is deposited between 40 nm and 100 nm thick.

14. The IC manufacturing technique of claim 12, wherein the silicon nitride is deposited approximately 50 nm thick.

15. The IC manufacturing technique of claim 12, wherein the compressive capping layer of silicon nitride provides approximately 2.5 GPa compressive stress.

16. An integrated circuit (IC) including a plurality of pFinFETs and nFinFETs, each FinFET comprising:
a source;
a drain;
a vertical channel connecting the source and the drain, the vertical channel forming a fin, the fin having a (100) surface orientation and a <110>channel direction orientation, the fin being formed above a substrate of the FinFET;
a gate straddling the fin; and
means for covering at least the fin and the gate to increase carrier mobility in the FinFET and provide compression to the fin and the gate,
wherein the surface orientation, the channel direction orientation, and the means for covering increase electron mobility for the nFinFETs and increase hole mobility for the pFinFETs, thereby improving both the nFinFETs and the pFinFETs.

17. The IC of claim 16, wherein the means for covering is silicon nitride.

18. The IC of claim 17, wherein the silicon nitride is between 40 nm and 100 nm thick.

19. The IC of claim 17, wherein the silicon nitride is approximately 50 nm thick.

20. The IC of claim 17, wherein the means for covering has approximately 2.5 GPa compressive stress.

* * * * *

UNITED STATES PATENT AND TRADEMARK OFFICE
CERTIFICATE OF CORRECTION

| | | |
|---|---|---|
| PATENT NO. | : 8,349,668 B2 | Page 1 of 1 |
| APPLICATION NO. | : 13/103677 | |
| DATED | : January 8, 2013 | |
| INVENTOR(S) | : Victor Moroz et al. | |

It is certified that error appears in the above-identified patent and that said Letters Patent is hereby corrected as shown below:

In the Claims:

<u>Column 5</u>
Line 39, insert --the-- before "carrier".
Line 64, insert --the-- before "carrier".

Signed and Sealed this
Twenty-third Day of September, 2014

Michelle K. Lee
*Deputy Director of the United States Patent and Trademark Office*